(12) United States Patent
Lee

(10) Patent No.: US 12,606,052 B2
(45) Date of Patent: Apr. 21, 2026

(54) MOBILITY SYSTEM AND METHOD FOR MANAGING UPDATING THEREOF

(71) Applicants: HYUNDAI MOTOR COMPANY, Seoul (KR); Kia Corporation, Seoul (KR)

(72) Inventor: Tae Ho Lee, Seoul (KR)

(73) Assignees: HYUNDAI MOTOR COMPANY, Seoul (KR); Kia Corporation, Seoul (KR)

( * ) Notice: Subject to any disclaimer, the term of this patent is extended or adjusted under 35 U.S.C. 154(b) by 899 days.

(21) Appl. No.: 17/723,941

(22) Filed: Apr. 19, 2022

(65) Prior Publication Data

US 2023/0123222 A1 Apr. 20, 2023

(30) Foreign Application Priority Data

Oct. 14, 2021 (KR) ......................... 10-2021-0136927

(51) Int. Cl.
| | |
|---|---|
| *B60L 58/22* | (2019.01) |
| *B60L 58/13* | (2019.01) |
| *G01R 31/367* | (2019.01) |
| *G01R 31/396* | (2019.01) |

(52) U.S. Cl.
CPC .............. *B60L 58/22* (2019.02); *B60L 58/13* (2019.02); *G01R 31/367* (2019.01); *G01R 31/396* (2019.01); *B60L 2240/54* (2013.01); *B60Y 2400/112* (2013.01)

(58) Field of Classification Search
USPC ............... 320/130, 132, 133, 134, 135, 136
See application file for complete search history.

(56) References Cited

U.S. PATENT DOCUMENTS

| | | | |
|---|---|---|---|
| 2014/0109075 A1* | 4/2014 | Hoffman | ............. G06F 11/1464 717/169 |
| 2015/0007155 A1 | 1/2015 | Hoffman et al. | |
| 2022/0413829 A1* | 12/2022 | Lee | ........................... G06F 8/65 |

OTHER PUBLICATIONS

Office Action issued in corresponding Korean Patent Application No. 10-2021-0136927 dated Feb. 26, 2026, with English translation.

* cited by examiner

*Primary Examiner* — Brian Ngo
(74) *Attorney, Agent, or Firm* — MORGAN, LEWIS & BOCKIUS LLP

(57) ABSTRACT

The present disclosure relates to a mobility system and an update management method thereof. An exemplary embodiment of the present disclosure provides a mobility system including: one or more controllers; one or more batteries; and an update management apparatus configured to determine an order of update target controllers and a battery to supply power to the update target controllers by using at least one of relative importance of the one or more controllers, a present state of the one or more batteries, or a vehicle driving state.

10 Claims, 7 Drawing Sheets

MOBILITY SYSTEM AND METHOD FOR MANAGING UPDATING THEREOF

CROSS-REFERENCE TO RELATED APPLICATION

This application claims the benefit of priority to Korean Patent Application No. 10-2021-0136927, filed on Oct. 14, 2021 in the Korean Intellectual Property Office, the entire contents of which are incorporated herein by reference.

BACKGROUND

(a) Technical Field

The present disclosure relates to a mobility system and an update management method thereof, and more particularly, to a technique for effectively updating a battery-based mobility system.

(b) Description of the Related Art

With development of the vehicle industry, in-vehicle controllers are continuously developed to provide convenience to drivers, and these controllers are updated with software, etc. based on wireless communication.

In general, a controller of an internal combustion engine vehicle performs an update when vehicle starting is turned on. However, when the vehicle starting is not turned on, the update is carried out in a state where a battery thereof is sufficiently charged, and when the battery is not sufficiently charged, the update is not performed.

Recently, even in a battery-based vehicle (mobility system), controllers directly related to driving, as in an internal combustion engine vehicle, are difficult to update when starting is on, so the update is performed when the starting is off, and in this case, the update is interrupted or difficult problems occur due to a risk of battery discharge by performing the update only with a charged battery in a starting-off state.

The above information disclosed in this Background section is only for enhancement of understanding of the background of the disclosure, and therefore, it may contain information that does not form the prior art that is already known in this country to a person of ordinary skill in the art.

SUMMARY

An exemplary embodiment of the present disclosure has been made in an effort to provide a mobility system and an update management method thereof, capable of providing a stable update by determining an order of update target controllers and a battery to supply power to the update target controllers using at least one of a present state of one or more batteries of the battery-based mobility system, relative importance of the update target controllers, or a vehicle driving state.

The various aspects of the present disclosure are not limited to the features mentioned above, and other technical features not mentioned can be clearly understood by those skilled in the art from the description of the claims.

An exemplary embodiment of the present disclosure provides a mobility system including: one or more controllers; one or more batteries; and an update management apparatus configured to determine an order of update target controllers and a battery to supply power to the update target controller using at least one of relative importance of the one or more controllers, a present state of the one or more batteries, or a vehicle driving state.

In an exemplary embodiment, the at least one battery may include: a driving system battery configured to supply main power to the mobility system; a first auxiliary battery configured to supply power when the one or more controllers are updated; and a second auxiliary battery configured to supply power when the one or more controllers are updated.

In an exemplary embodiment, the update management device may perform an update by using the first auxiliary battery when updating a first controller and a second controller among the one or more controllers, and perform the update by using the second auxiliary battery when updating a third controller among the one or more controllers.

In an exemplary embodiment, the update management device, when a battery capacity level of the first auxiliary battery is smaller than a battery capacity level required for updating the first controller and the second controller, may supplementally charge the first auxiliary battery by using the driving system battery, and when the battery capacity level of the first auxiliary battery is equal to or greater than the battery capacity level required for updating the first controller and the second controller, updates the first controller and the second controller.

In an exemplary embodiment, the update management device, when a battery capacity level of the first auxiliary battery is smaller than a battery capacity level required for updating the first controller and the second controller, may perform the update of the second controller by using the second auxiliary battery instead of the first auxiliary battery.

In an exemplary embodiment, the update management device, when an update importance level of the first controller among the one or more controllers is higher than a predetermined reference value, may perform the update of the first controller without interruption by using one of the first auxiliary battery or the second auxiliary battery, having a battery capacity level that is greater than the battery capacity level required for the update of the first controller.

In an exemplary embodiment, the update management device, in a case where the first controller among the one or more controllers are not able to be updated while the vehicle is driving and the second controller among the one or more controllers are able to be updated while the vehicle is driving, when the vehicle starts driving during the update of the first controller while the vehicle is stopped, may stop the update of the first controller and may perform the update of the second controller first.

An exemplary embodiment of the present disclosure provides an update management method of a mobility system, including: receiving present state information of one or more batteries from the one or more batteries; and an update management apparatus configured to determine an order of update target controllers and a battery to supply power to the update target controller using at least one of relative importance of the one or more controllers, a present state of the one or more batteries, or a vehicle driving state.

In an exemplary embodiment, the determining of the update order of the update target controllers and the battery to supply power to the update target controllers may include: performing an update by using a first auxiliary battery among the one or more batteries when updating a first controller and a second controller among the one or more controllers; and performing an update by using a second auxiliary battery among the one or more batteries when updating a third controller among the one or more controllers.

In an exemplary embodiment, the determining of the update order of the update target controllers and the battery to supply power to the update target controllers may further include, when a battery capacity level of the first auxiliary battery is smaller than a battery capacity level required for updating the first controller and the second controller, supplementally charging the first auxiliary battery by using a driving system battery among the one or more controllers.

In an exemplary embodiment, the determining of the update order of the update target controllers and the battery to supply power to the update target controllers may further include updating the first controller and the second controller when the battery capacity level of the first auxiliary battery is equal to or greater than the battery capacity level required for updating the first controller and the second controller.

In an exemplary embodiment, the determining of the update order of the update target controllers and the battery to supply power to the update target controllers may further include, when a battery capacity level of the first auxiliary battery is smaller than a battery capacity level required for updating the first controller and the second controller, performing the update of the second controller by using the second auxiliary battery instead of the first auxiliary battery.

In an exemplary embodiment, the determining of the update order of the update target controllers and the battery to supply power to the update target controllers may further include, when an update importance level of the first controller among the one or more controllers is higher than a predetermined reference value, performing the update of the first controller without interruption by using one of the first auxiliary battery or the second auxiliary battery, having a battery capacity level that is greater than the battery capacity level required for the update of the first controller.

In an exemplary embodiment, the determining of the update order of the update target controllers and the battery to supply power to the update target controllers may further include, in a case where the first controller among the one or more controllers are not able to be updated while the vehicle is driving and the second controller among the one or more controllers are able to be updated while the vehicle is driving, stopping the update of the first controller and performing the update of the second controller first when the vehicle starts driving during the update of the first controller while the vehicle is stopped.

In an exemplary embodiment, the determining of the update order of the update target controllers and the battery to supply power to the update target controllers may further include, determining the present state of the one or more batteries when external power is supplied, and determining an update order of the one or more controllers and whether to execute it.

According to the present technique, it is possible to provide a mobility system and an update management method thereof, capable of providing a stable update by determining an order of update target controllers and a battery to supply power to the update target controllers using at least one of a present state of one or more batteries of the battery-based mobility system, relative importance of the update target controllers, or a vehicle driving state.

In addition, various effects that can be directly or indirectly identified through this document may be provided.

DETAILED DESCRIPTION OF THE EMBODIMENTS

Figure 1:
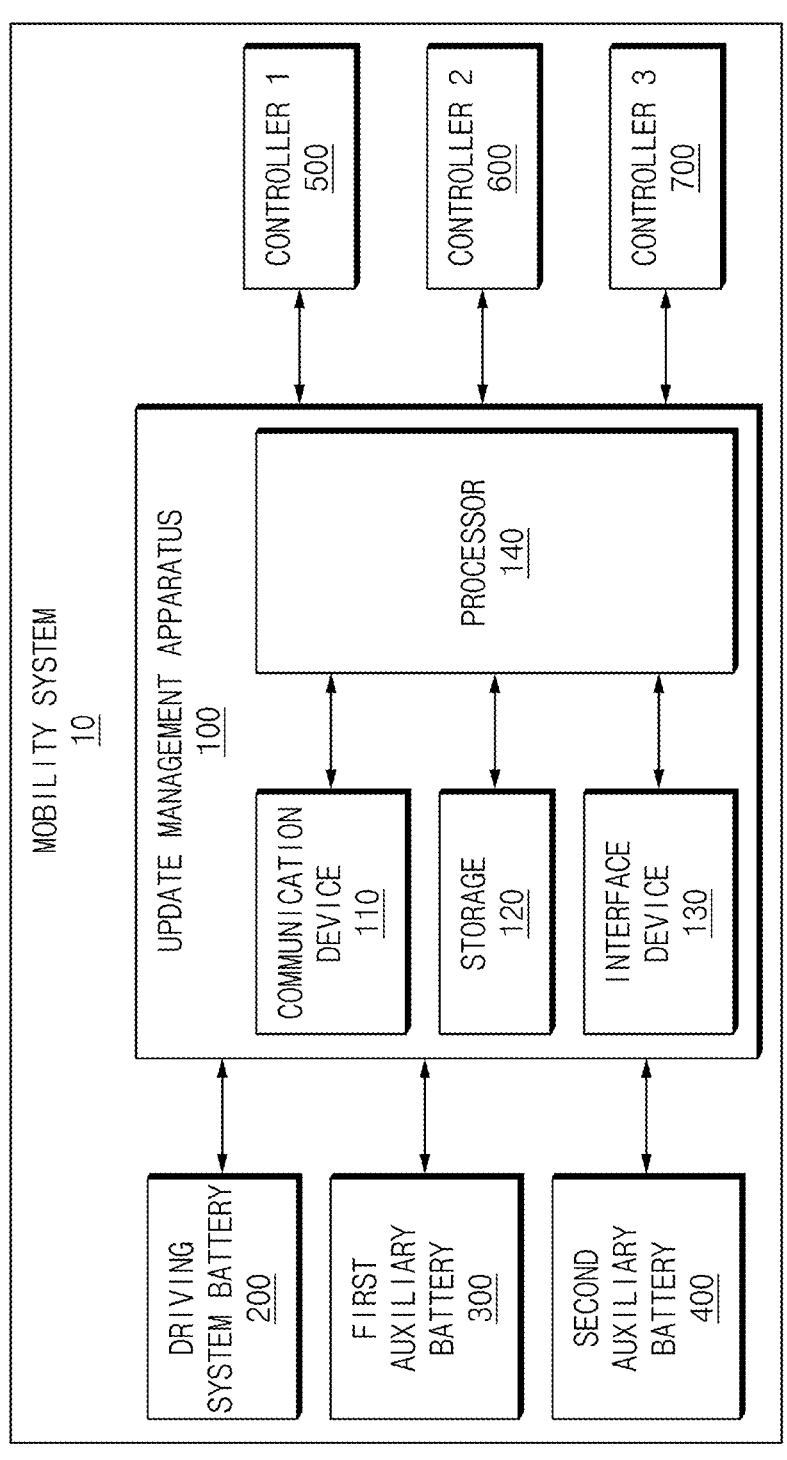
FIG. 1 illustrates a block diagram showing a configuration of a battery-based mobility system including an update management apparatus according to an exemplary embodiment of the present disclosure.

Hereinafter, some exemplary embodiments of the present disclosure will be described in detail with reference to exemplary drawings. It should be noted that in adding reference numerals to constituent elements of each drawing, the same constituent elements have the same reference numerals as possible even though they are indicated on different drawings. In addition, in describing exemplary embodiments of the present disclosure, when it is determined that detailed descriptions of related well-known configurations or functions interfere with understanding of the exemplary embodiments of the present disclosure, the detailed descriptions thereof will be omitted.

In describing constituent elements according to an exemplary embodiment of the present disclosure, terms such as first, second, A, B, (a), and (b) may be used. These terms are only for distinguishing the constituent elements from other constituent elements, and the nature, sequences, or orders of the constituent elements are not limited by the terms. In addition, all terms used herein including technical scientific terms have the same meanings as those which are generally understood by those skilled in the technical field to which the present disclosure pertains (those skilled in the art) unless they are differently defined. Terms defined in a generally used dictionary shall be construed to have meanings matching those in the context of a related art, and shall not be construed to have idealized or excessively formal meanings unless they are clearly defined in the present specification.

Hereinafter, exemplary embodiments of the present disclosure will be described in detail with reference to FIG. 1 to FIG. 7.

FIG. 1 illustrates a block diagram showing a configuration of a battery-based mobility system including an update management apparatus according to an exemplary embodiment of the present disclosure.

The battery-based mobility system may include an electric vehicle, a hydrogen fuel cell vehicle, an urban air mobility (UAM), an electric powered vessel, an electric scooter, and the like. This mobility system 10 forms energy providing environment differently compared to controller update logic of an internal combustion engine.

Referring to FIG. 1, the mobility system 10 includes an update management apparatus 100, a driving system battery 200 serving as a main battery, a first auxiliary battery 300 for operating electric equipment, a second auxiliary battery 400, and a plurality of first, second, and third controllers 500, 600, and 700, which are targets to be updated. In this case, although the auxiliary batteries 300 and 400 are illustrated as two, a number of auxiliary batteries 300 and 400 is not limited thereto.

The update management apparatus 100 according to the present disclosure may provide a much more efficient and stable update than update logic of an existing internal combustion engine in consideration of a present state (e.g., a battery capacity level or a state of charge) of a battery that supplies a voltage for an update thereof.

The update management apparatus 100 according to the exemplary embodiment of the present disclosure may be implemented inside the vehicle. In this case, the update management apparatus 100 may be integrally formed with internal control units of the vehicle, or may be implemented as a separate device to be connected to control units of the vehicle by a separate connection means.

The update management apparatus 100 may determine an order of target controllers to be updated and a battery for supplying the target controllers to be updated based on at least one of relative importance of one or more of the controllers 500, 600, and 700, a present state of the one or more of the batteries 300 and 400, or a vehicle driving state.

Referring to FIG. 1, the update management apparatus 100 may include a communication device 110, a storage 120, an interface device 130, and a processor 140.

The communication device 110 is a hardware device implemented with various electronic circuits to transmit and receive signals through a wireless or wired connection, and may transmit and receive information based on in-vehicle devices and in-vehicle network communication techniques. As an example, the in-vehicle network communication techniques may include controller area network (CAN) communication, local interconnect network (LIN) communication, flex-ray communication, Ethernet communication, and the like.

In addition, the communication device 110 may perform communication by using a server, infrastructure, or third vehicles outside the vehicle, and the like through a wireless Internet technique or short range communication technique. Herein, the wireless Internet technique may include wireless LAN (WLAN), wireless broadband (Wibro), Wi-Fi, world Interoperability for microwave access (Wimax), etc. In addition, short-range communication technique may include bluetooth, ZigBee, ultra-wideband (UWB), radio frequency identification (RFID), infrared data association (IrDA), and the like. For example, the communication device 110 may receive information for an update from an external server or a vehicle.

The storage 120 may store data and/or algorithms required for the processor 140 to operate, and the like.

As an example, the storage 120 may store the relative importance of at least one of the controllers 500, 600, and 700, current battery state information received from each of the batteries 200, 300, and 400, and the like.

The storage 120 may include a storage medium of at least one type among memories of types such as a flash memory, a hard disk, a micro, a card (e.g., a secure digital (SD) card or an extreme digital (XD) card), a random access memory (RAM), a static RAM (SRAM), a read-only memory (ROM), a programmable ROM (PROM), an electrically erasable PROM (EEPROM), a magnetic memory (MRAM), a magnetic disk, and an optical disk.

The interface device 130 may include an input means for receiving a control command from a user and an output means for outputting an operation state of the apparatus 100 and results thereof. Herein, the input means may include a key button, and may further include a mouse, a joystick, a jog shuttle, a stylus pen, and the like. In addition, the input means may further include a soft key implemented on the display.

For example, the interface device 130 may display a state of each of the battery 200, 300, and 400, an update state of each of the controller 500, 600, 700, and the like.

The interface device 130 may be implemented as a head-up display (HUD), a cluster, an audio video navigation (AVN), a human machine interface (HM), a user setting menu (USM), or the like.

The output means may include a display, and may further include a voice output means such as a speaker. In this case, when a touch sensor formed of a touch film, a touch sheet, or a touch pad is provided on the display, the display may operate as a touch screen, and may be implemented in a form in which an input device and an output device are integrated.

In this case, the display may include at least one of a liquid crystal display (LCD), a thin film transistor liquid crystal display (TFT LCD), an organic light emitting diode display (OLED display), a flexible display, a field emission display (FED), or a 3D display.

The processor 140 may be electrically connected to the communication device 110, the storage 120, the interface device 130, and the like, may electrically control each component, and may be an electrical circuit that executes software commands, thereby performing various data processing and calculations described below.

The processor 140 may process a signal transferred between components of the update management apparatus 100, and may perform overall control such that each of the components can perform its function normally.

The processor 140 may be implemented in the form of hardware, software, or a combination of hardware and software, or may be implemented as microprocessor, and may be, e.g., an electronic control unit (ECU), a micro controller unit (MCU), or other sub-controllers mounted in the vehicle.

When updating the first controller 500 and the second controller 600 among one or more controllers, the processor 140 may perform the update by using the first auxiliary battery 300. In addition, the processor 140 may perform the update by using the second auxiliary battery 400 when updating the third controller 700 among the one more controllers 500, 600, and 700.

When a battery capacity level of the first auxiliary battery 300 is smaller than a battery capacity level required for updating the first controller 500 and the second controller 600, the processor 140 may supplementally charge the first auxiliary battery 300 by using the driving system battery 200, and when the battery capacity level of the first auxiliary battery 300 is equal to or greater than the battery capacity level required for updating the first controller 500 and the second controller 600, may update the first controller 500 and the second controller 600.

When the battery capacity level of the first auxiliary battery 300 is smaller than the battery capacity level required for updating the first controller 500 and the second controller 600, the processor 140 may update the second controller 600 by using the second auxiliary battery 400 instead of the first auxiliary battery 300.

When an update importance level of the first controller 500 among the one or more controllers is higher than a predetermined reference value, the processor 140 may perform the update of the first controller 500 without interruption by using one of the first auxiliary battery 300 or the second auxiliary battery 400, having a battery capacity level that is greater than the battery capacity level required for the update of the first controller 500.

In the case where the first controller 500 among the one or more controllers cannot be updated while the vehicle is driving and the second controller 600 among the one or more controllers can be updated while the vehicle is driving, when the vehicle starts driving while the first controller 500 is updated in a stopped state of the vehicle, the processor 140 may stop the update of the first controller 500, and may perform the update of the second controller 600 first.

The driving system battery 200 may supply power for driving the mobility system 10.

The first auxiliary battery 300 and the second auxiliary battery 400 may supply power when the one or more controllers 500, 600, and 700 are updated. Although two auxiliary batteries are illustrated in FIG. 1, the present disclosure is not limited thereto, and more auxiliary batteries may be provided or a single auxiliary battery may be provided.

The first, second, and third controllers 500, 600, and 700 may implement each function of the mobility system 10. Although 3 controllers are illustrated in FIG. 1, the present disclosure is not limited thereto, and more controllers may be provided.

Hereinafter, an update management method according to an exemplary embodiment of the present disclosure will be described in detail with reference to FIG. 2 to FIG. 6.

Hereinafter, it is assumed that the update management apparatus 100 of FIG. 1 performs the processes of FIG. 2 to FIG. 6. In addition, in the description of FIG. 2 to FIG. 6, operations described as being performed by the update management apparatus 100 may be understood as being controlled by the processor 140 of the update management apparatus 100.

Figure 2:
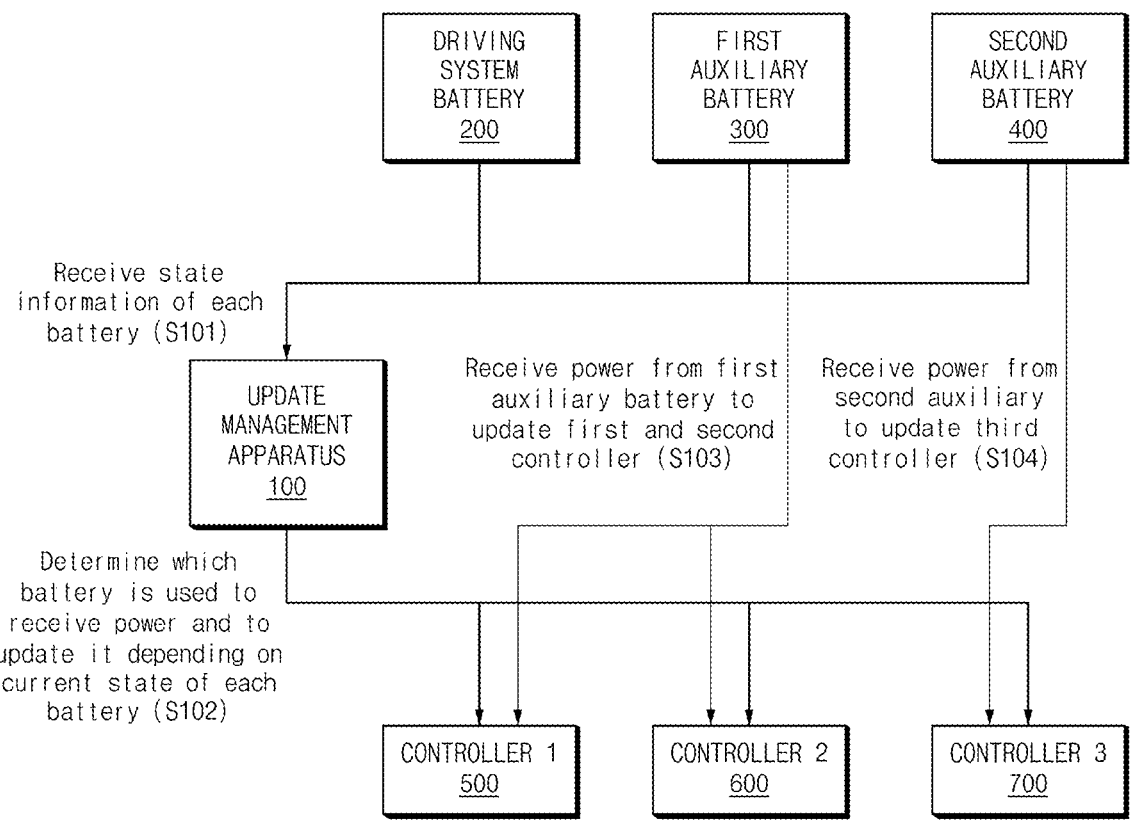
FIG. 2 illustrates a view for describing a process of determining an update target controller and a battery supplying power based on relative importance of the update target controller and whether a vehicle is driven according to an exemplary embodiment of the present disclosure.

FIG. 2 illustrates a view for describing a process of determining an update target controller and a battery supplying power based on relative importance of the update target controller and whether a vehicle is driven according to an exemplary embodiment of the present disclosure.

Referring to FIG. 2, the update management apparatus 100 receives present state information of the batteries 200, 300, and 400 from the respective batteries 200, 300, and 400 (S101).

Then, the update management apparatus 100 may determines which battery is used for each controller to receive power and to update it depending on a present state (e.g., a battery capacity level) of each of the batteries 200, 300, and 400, relative update importance of the controller, and whether the vehicle is driven (S102).

That is, the present state of each battery is the battery capacity level, and the update management apparatus 100 may determine whether the battery capacity level is sufficient to complete the update of the controllers. In particular, the update management apparatus 100 may determine a battery to supply power to each controller by using the relative update importance of the controller and the battery capacity level. In this case, when the relative update importance of the controller is high compared to other controllers, it indicates that the update must be completed to the end without interruption of the update in the middle when updating each controller. For example, in the case where the battery capacity level of the auxiliary battery 300 is 5 Ah, when the expected battery required for updating the first controller 500 is 7 Ah and the first controller 500 is a controller with high update importance, if power is supplied by using the first auxiliary battery 300 for the update of the first controller 500, the update may be stopped due to insufficient power in the middle. In this case, the first controller 500 is a controller of high importance that the update should not be interrupted, and in this case, it may be determined to supply power to the first controller 500 by using the second auxiliary battery 400 having a high battery capacity level instead of the first auxiliary battery 300.

In addition, in the case where the first controller 500 is a controller that can be updated only when the vehicle is stopped, the update of the first controller 500 may be controlled to be performed while the vehicle is stopped, and when the vehicle starts driving, the update of the controller that can be updated while the vehicle is driving may be controlled to proceed.

As such, the update management apparatus 100 may determine which controller receives power from which battery to perform the update based on the update importance of each of the controllers 500, 600, and 700 and priority depending on a driving condition of the vehicle.

The update management apparatus 100 receives power from the first auxiliary battery 300 to perform the update of the first and second controllers 500 and 600 (S103), and receives power from the second auxiliary battery 400 to perform the update of the third controller 700 (S104).

Figure 3:
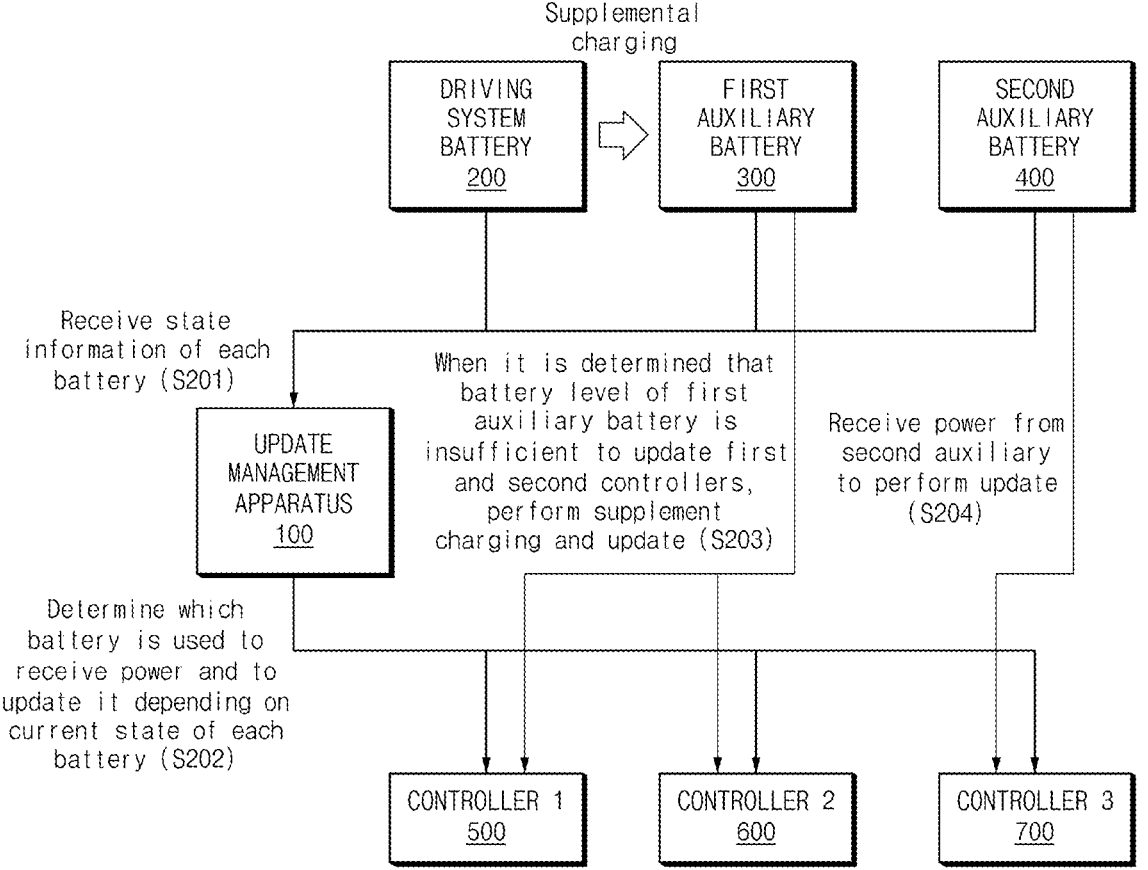
FIG. 3 illustrates a view for describing a process of performing an update after supplementally charging a battery when a battery capacity level of the battery is insufficient according to an exemplary embodiment of the present disclosure.

FIG. 3 illustrates a view for describing a process of performing an update after supplementally charging a battery when a battery capacity level of the battery is insufficient according to an exemplary embodiment of the present disclosure.

Referring to FIG. 3, the update management apparatus 100 receives present state information of the batteries 200, 300, and 400 from the respective batteries 200, 300, and 400 (S201).

Next, the update management apparatus 100 determines which battery is used to receive power and to perform the update depending on the present state of each of the batteries 200, 300, and 400 (S202). For example, the update management apparatus 100 may determine to receive power from the first auxiliary battery 300 and to perform the update of the first and second controllers 500 and 600, and to receive power from the second auxiliary battery 400 and to perform the update of the third controller 700.

In this situation, the update management apparatus 100 determines whether the battery capacity level of the first auxiliary battery 300 is insufficient to update the first and second controllers 500 and 600, when it is determined that it is insufficient, supplementally charges the first auxiliary battery 300 through the driving system battery 200, and when the battery capacity level of the first auxiliary battery 300 is charged more than a predetermined reference value, updates the first and second controllers 500 and 600 (S203).

In this case, the update management apparatus 100 receives power from the second auxiliary battery 400 to perform the update of the third controller 700 (S204).

Figure 4:
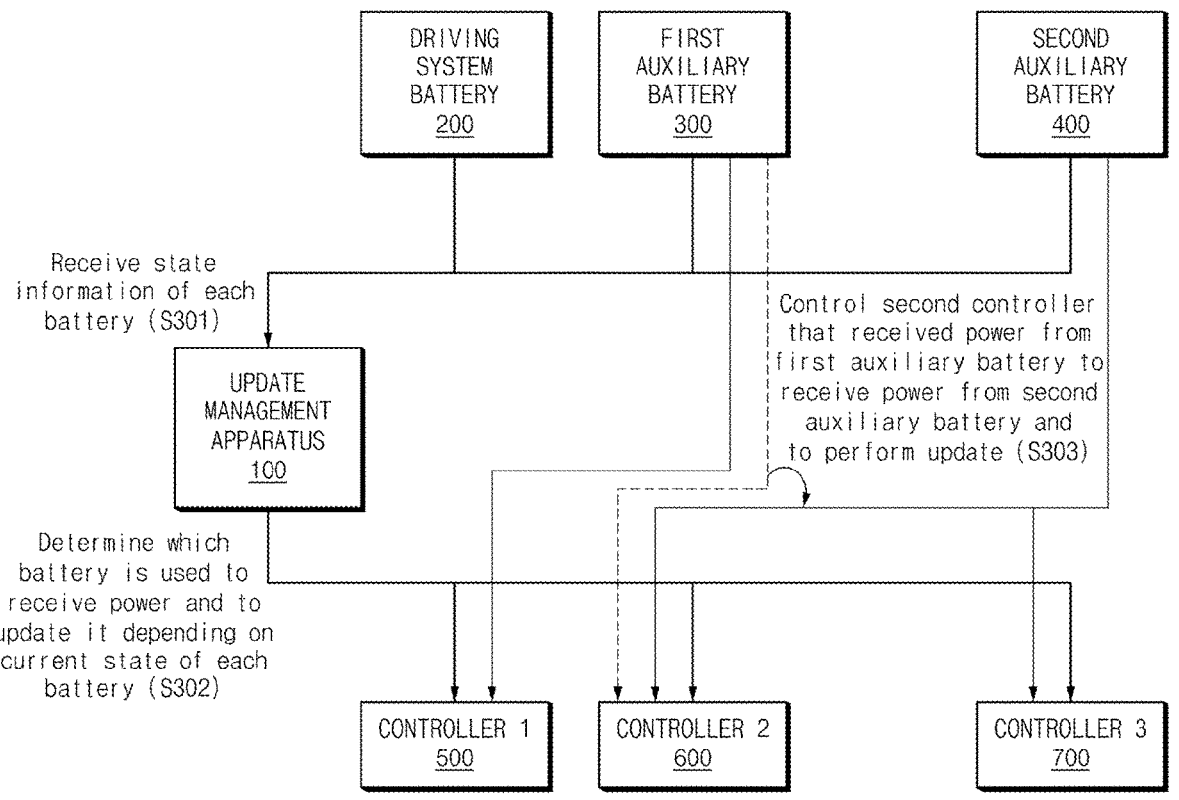
FIG. 4 illustrates a view for describing a process of changing a battery supplying power when a controller is updated in the case where a battery capacity level of a battery is insufficient according to an exemplary embodiment of the present disclosure.

FIG. 4 illustrates a view for describing a process of changing a battery supplying power when a controller is updated in the case where a battery capacity level of a battery is insufficient according to an exemplary embodiment of the present disclosure.

Referring to FIG. 4, the update management apparatus 100 receives present state information of the batteries 200, 300, and 400 from the respective batteries 200, 300, and 400 (S301).

Next, the update management apparatus 100 determine which battery is used to receive power and to perform the update depending on the present state of each of the batteries 200, 300, and 400 (S302).

The update management apparatus 100 may control the power to be received from the second auxiliary battery 400 instead of the first auxiliary battery 300 to update the second controller 600 (S303) when it is determined that the battery capacity level is insufficient for the first auxiliary battery 300 to update the first and second controllers 500 and 600 in a situation where it is determined to receive power from the first auxiliary battery 300 and to perform the update of the first and second controllers 500 and 600, and to receive power from the second auxiliary battery 400 and to perform the update of the third controller 700.

Figure 5:
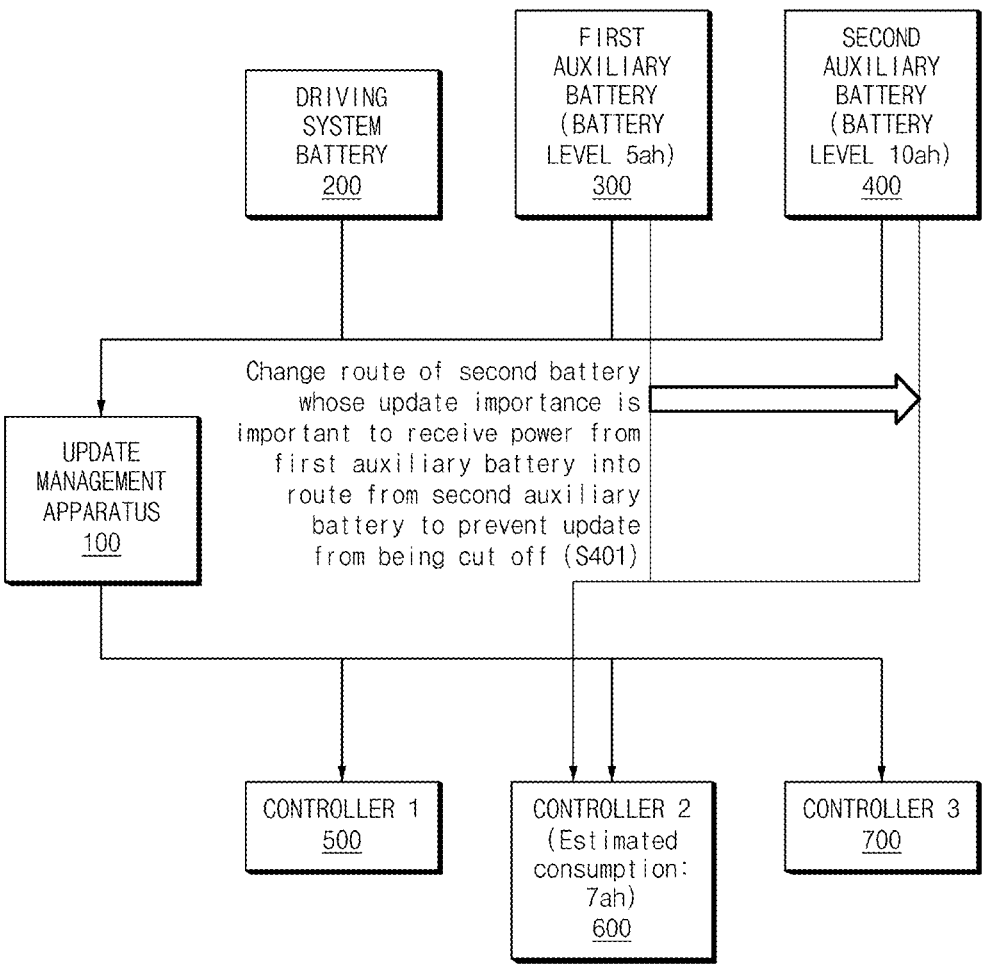
FIG. 5 illustrates a view for describing a process of changing a battery supplying power when a controller is updated depending on relative importance of an update target controller, a battery capacity level of the battery, and estimated update power consumption according to an exemplary embodiment of the present disclosure

FIG. 5 illustrates a view for describing a process of changing a battery supplying power when a controller is updated depending on relative importance of an update target controller, a battery capacity level of the battery, and estimated update power consumption according to an exemplary embodiment of the present disclosure Referring to FIG. 5, an example in which the current battery capacity level of the first auxiliary battery 300 is 5 Ah, the current battery capacity level of the second auxiliary battery 400 is 10 Ah, the second controller 600 is a controller whose relative update importance is high, the update of the second controller 600 must not be cut off, and it consumes a battery capacity level of 7 Ah during the update will be described.

In this case, the second controller 600 needs the battery capacity level of 7 Ah for the update, but the current battery capacity level of the first auxiliary battery 300 is 5 Ah, and thus when the update is performed by receiving power from the first auxiliary battery 300, the second controller 600 has no choice but to stop the update because power supply is cut off during the update.

Accordingly, the update management apparatus 100 controls the power to be received from the second auxiliary battery 400 with a sufficient battery capacity level and to update the second controller 600 (S401). Accordingly, the second controller 600 may perform the update without interruption of the update.

Figure 6:
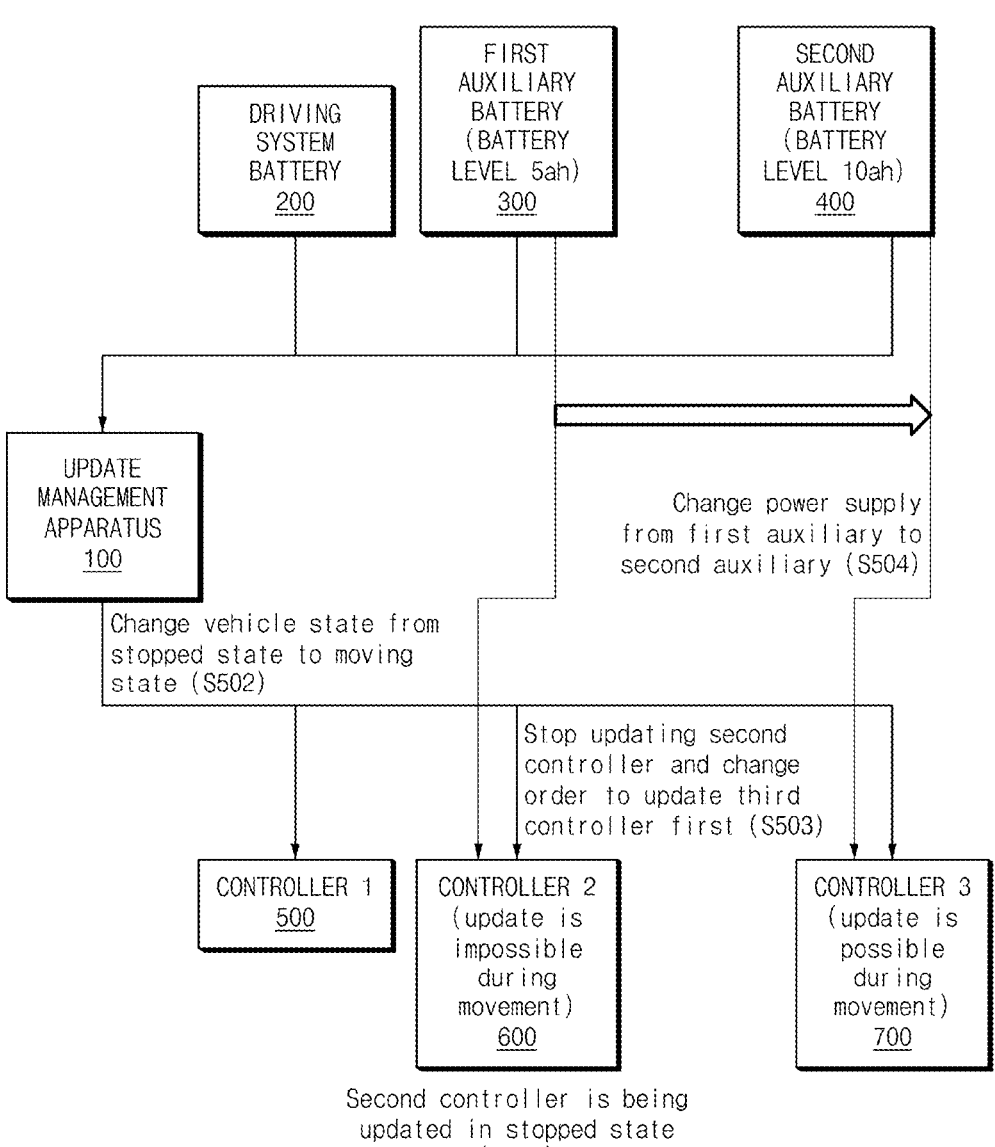
FIG. 6 illustrates a view for describing a process of changing an update order of a controller depending on whether a vehicle is driven according to an exemplary embodiment of the present disclosure.

FIG. 6 illustrates a view for describing a process of changing an update order of a controller depending on whether a vehicle is driven according to an exemplary embodiment of the present disclosure.

Referring to FIG. 6, an example in which the current battery capacity level of the first auxiliary battery 300 is 5 Ah, the current battery capacity level of the second auxiliary battery 400 is 10 Ah, the second controller 600 is not able to be updated while the vehicle is driving, and the third controller 700 is able to be updated while the vehicle is driving will be described.

The update management apparatus 100 performs an update of the second controller 600 in a vehicle stop state (S401).

Thereafter, the update management apparatus 100 monitors a moving state of the vehicle, when the vehicle is changed from a stopped state to the moving state (S502), cannot continue to update the second controller 600, and stops updating the second controller 600 and changes the order to update the third controller 700 first (S503).

In this case, although the second controller 600 was receiving power from the first auxiliary battery 300, the power supply is changed to be performed by the second auxiliary battery 400 for the update of the third controller 700 (S504).

As such, according to the present disclosure, it is possible to perform update by determining a battery for supplying power to each controller based on the battery capacity level, the relative update importance of the controller, and the vehicle driving state. Further, according to the present disclosure, it is determined whether the update of the controller is possible based on the current battery capacity level and, if not possible, the update may be controlled to be started after supplementally charging from the drive system battery, or the update may be started after the battery to supply power for the update of the controller is changed to a battery with sufficient battery charge. In addition, according to the present disclosure, the update order of the controller may be changed depending on the driving state of the vehicle.

Figure 7:
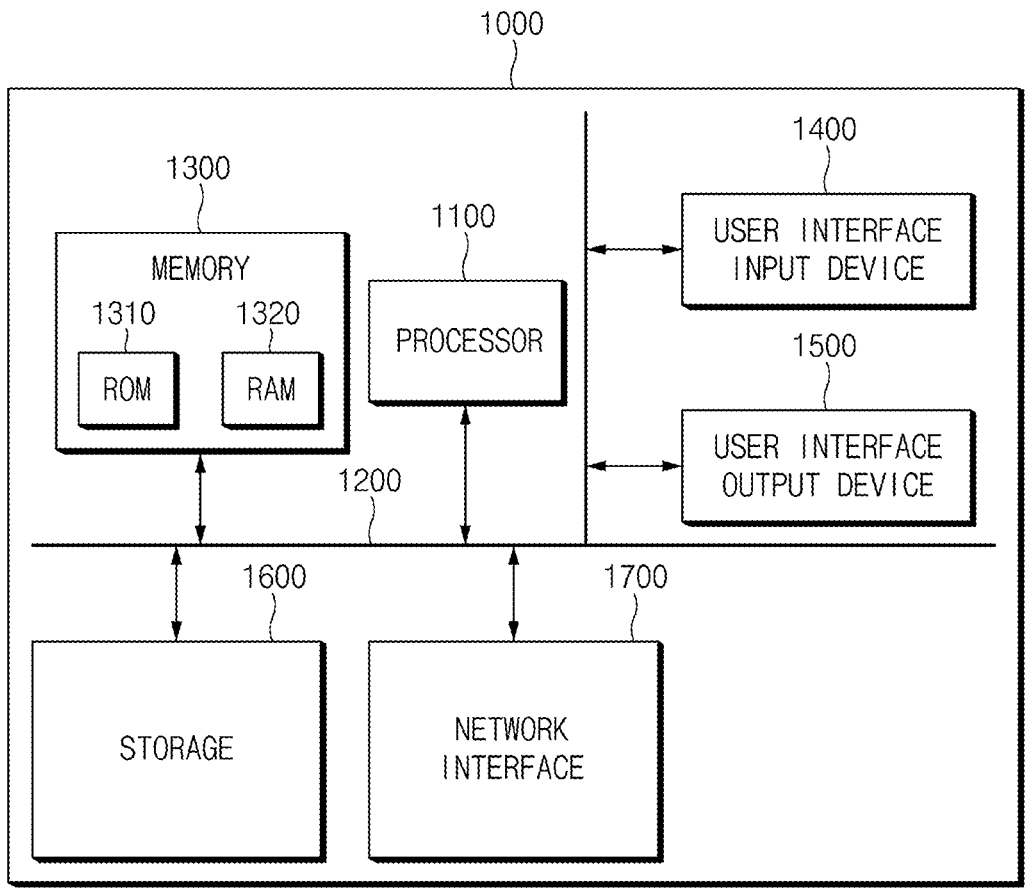
FIG. 7 illustrates a computing system according to an exemplary embodiment of the present disclosure.

FIG. 7 illustrates a computing system according to an exemplary embodiment of the present disclosure.

Referring to FIG. 7, the computing system 1000 includes at least one processor 1100 connected through a bus 1200, a memory 1300, a user interface input device 1400, a user interface output device 1500, and a storage 1600, and a network interface 1700.

The processor 1100 may be a central processing unit (CPU) or a semiconductor device that performs processing on commands stored in the memory 1300 and/or the storage 1600. The memory 1300 and the storage 1600 may include various types of volatile or nonvolatile storage media. For example, the memory 1300 may include a read only memory (ROM) 1310 and a random access memory (RAM) 1320.

Accordingly, steps of a method or algorithm described in connection with the exemplary embodiments disclosed herein may be directly implemented by hardware, a software module, or a combination of the two, executed by the processor 1100. The software module may reside in a storage medium (i.e., the memory 1300 and/or the storage 1600) such as a RAM memory, a flash memory, a ROM memory, an EPROM memory, a EEPROM memory, a register, a hard disk, a removable disk, and a CD-ROM.

An exemplary storage medium is coupled to the processor 1100, which can read information from and write information to the storage medium. Alternatively, the storage medium may be integrated with the processor 1100. The processor and the storage medium may reside within an application specific integrated circuit (ASIC). The ASIC may reside within a user terminal. Alternatively, the processor and the storage medium may reside as separate components within the user terminal.

The above description is merely illustrative of the technical idea of the present disclosure, and those skilled in the art to which the present disclosure pertains may make various modifications and variations without departing from the essential characteristics of the present disclosure.

Therefore, the exemplary embodiments disclosed in the present disclosure are not intended to limit the technical ideas of the present disclosure, but to explain them, and the scope of the technical ideas of the present disclosure is not limited by these exemplary embodiments. The protection range of the present disclosure should be interpreted by the claims below, and all technical ideas within the equivalent range should be interpreted as being included in the scope of the present disclosure.

What is claimed is:

1. A mobility system comprising:
one or more controllers;
one or more batteries; and
an update management apparatus configured to determine an update target controller, an update of which is performed first among the one or more controllers, and a battery for supplying power to the update target controller among the one or more batteries by using at least one of relative importance of the one or more controllers, a present state of the one or more batteries, or a vehicle driving state,
wherein the one or more batteries includes:
a driving system battery configured to supply main power to the mobility system;
a first auxiliary battery configured to supply power when the one or more controllers are updated; and
a second auxiliary battery configured to supply power when the one or more controllers are updated wherein the update management apparatus,
when a battery capacity level of the first auxiliary battery is smaller than a battery capacity level required for updating the first controller and the second controller,
supplementally charges the first auxiliary battery by using the driving system battery, and when the battery capacity level of the first auxiliary battery is equal to or greater than the battery capacity level required for updating the first controller and the second controller, updates the first controller and the second controller.

2. The mobility system of claim 1, wherein
the update management apparatus
performs an update by using the first auxiliary battery when updating a first controller and a second controller among the one or more controllers, and
performs the update by using the second auxiliary battery when updating a third controller among the one or more controllers.

3. The mobility system of claim 2, wherein
when a battery capacity level of the first auxiliary battery is smaller than a battery capacity level required for updating the first controller and the second controller,
the update management apparatus performs the update of the second controller by using the second auxiliary battery instead of the first auxiliary battery.

4. The mobility system of claim 2, wherein
when an update importance level of the first controller among the one or more controllers is higher than a predetermined reference value,
the update management apparatus performs the update of the first controller without interruption by using one of the first auxiliary battery or the second auxiliary battery, having a battery capacity level that is greater than a battery capacity level required for the update of the first controller.

5. The mobility system of claim 2, wherein
in a case where,
the first controller among the one or more controllers are not able to be updated while the vehicle is driving and the second controller among the one or more controllers are able to be updated while the vehicle is driving, and
when the vehicle starts driving during the update of the first controller while the vehicle is stopped, the update management apparatus stops the update of the first controller and performs the update of the second controller first.

6. An update management method of a mobility system, comprising:
receiving present state information of one or more batteries from the one or more batteries; and
determining an update target controller, an update of which is performed first among one or more controllers, and a battery for supplying power to the update target controller among the one or more batteries by using at least one of relative importance of the one or more controllers, a present state of the one or more batteries, or a vehicle driving state,
wherein the determining an update order of update target controllers and a battery to supply power to the update target controllers includes:
performing an update by using a first auxiliary battery among the one or more batteries when updating a first controller and a second controller among the one or more controllers; and
performing an update by using a second auxiliary battery among the one or more batteries when updating a third controller among the one or more controllers wherein
the determining of the update target controller and the battery for supplying power to the update target controller further includes
when a battery capacity level of the first auxiliary battery is smaller than a battery capacity level required for updating the first controller and the second controller, supplementally charging the first auxiliary battery by using a driving system battery among the one or more controllers,
updating the first controller and the second controller when the battery capacity level of the first auxiliary battery is equal to or greater than the battery capacity level required for updating the first controller and the second controller.

7. The update management method of claim 6, wherein
the determining of the update target controller and the battery for supplying power to update target controller further includes
when a battery capacity level of the first auxiliary battery is smaller than a battery capacity level required for updating the first controller and the second controller,
performing the update of the second controller by using the second auxiliary battery instead of the first auxiliary battery.

8. The update management method of claim 6, wherein
the determining of the update target controller and the battery for supplying power to the update target controller further includes
when an update importance level of the first controller among the one or more controllers is higher than a predetermined reference value,
performing the update of the first controller without interruption by using one of the first auxiliary battery or the second auxiliary battery, having a battery capacity level that is greater than a battery capacity level required for the update of the first controller.

9. The update management method of claim 6, wherein
the determining of the update target controller and the battery for supplying power to the update target controller further includes
in a case where the first controller among the one or more controllers are not able to be updated while the vehicle is driving and the second controller among the one or more controllers are able to be updated while the vehicle is driving, stopping the update of the first controller and performing the update of the second controller first when the vehicle starts driving during the update of the first controller while the vehicle is stopped.

10. The update management method of claim 6, wherein the determining of the update target controller and the battery for supplying power to the update target controller further includes determining the present state of the one or more batteries when external power is supplied, and determining an update order of the one or more controllers and whether to execute the update.

\* \* \* \* \*